(12) United States Patent
Ahmad et al.

(10) Patent No.: US 10,780,647 B2
(45) Date of Patent: Sep. 22, 2020

(54) BROADBAND MICROWAVE PROCESSING SYSTEM

(71) Applicants: Iftikhar Ahmad, Raleigh, NC (US); Clayton R. DeCamillis, Raleigh, NC (US); Richard C. Hazelhurst, Holly Springs, NC (US); Michael L. Hampton, Raleigh, NC (US)

(72) Inventors: Iftikhar Ahmad, Raleigh, NC (US); Clayton R. DeCamillis, Raleigh, NC (US); Richard C. Hazelhurst, Holly Springs, NC (US); Michael L. Hampton, Raleigh, NC (US)

( * ) Notice: Subject to any disclaimer, the term of this patent is extended or adjusted under 35 U.S.C. 154(b) by 384 days.

(21) Appl. No.: 15/732,338

(22) Filed: Oct. 26, 2017

(65) Prior Publication Data

US 2018/0130638 A1 May 10, 2018

Related U.S. Application Data

(60) Provisional application No. 62/497,062, filed on Nov. 7, 2016.

(51) Int. Cl.
*H05B 6/64* (2006.01)
*H05B 6/68* (2006.01)
(Continued)

(52) U.S. Cl.
CPC ...... *B29C 65/5014* (2013.01); *B29C 65/1425* (2013.01); *B29C 65/1438* (2013.01); *B29C 65/1483* (2013.01); *B29C 65/3408* (2013.01); *H01J 37/32229* (2013.01); *H01J 37/32302* (2013.01); *H05B 6/64* (2013.01)

(58) Field of Classification Search
CPC ............ B29C 65/5014; B29C 65/1425; B29C 65/1438; B29C 65/1483; B29C 65/3408; H05B 6/64; H01J 37/32229; H01J 37/32302

USPC ....... 219/676, 686, 709, 716, 745, 717, 761, 219/757, 687, 690, 693; 118/723 MW,
(Continued)

(56) References Cited

U.S. PATENT DOCUMENTS 4,866,346 A 9/1989 Gaudreau et al.
5,321,222 A 6/1994 Bible et al.
(Continued)

OTHER PUBLICATIONS

Neyts, E. C. Plasma-surface interactions in plasma catalysis. Plasma Chem Plasma Process (2016), 36:185-212.
(Continued)

*Primary Examiner* — Quang T Van
(74) *Attorney, Agent, or Firm* — Robert J. Lauf

(57) ABSTRACT

A microwave processing system includes:
  a broadband variable frequency microwave (VFM) source;
  a plurality of waveguide applicators, each of which includes a waveguide transition and is capable of supporting a selected subset of frequencies within the bandwidth of the broadband VFM source;
  a microwave switching means allowing the microwave source to be connected to any one of the waveguide transitions so that microwave power is delivered to the corresponding waveguide applicator; and wherein each of the waveguide applicators includes at least one channel through which a microwave transparent tube may be run so that process fluid flowing through the tube may be exposed to microwave power in the applicator.

14 Claims, 10 Drawing Sheets

(51) Int. Cl.
*B29C 65/50* (2006.01)
*B29C 65/14* (2006.01)
*B29C 65/34* (2006.01)
*H01J 37/32* (2006.01)

(58) Field of Classification Search
USPC ............ 118/723 ME, 723 R; 315/111.21, 39, 315/39.3; 427/575, 569
See application file for complete search history.

(56) References Cited

U.S. PATENT DOCUMENTS

| | | | | |
|---|---|---|---|---|
| 5,841,237 | A | * | 11/1998 | Alton ..................... H01J 27/18 315/111.81 |
| 5,919,218 | A | * | 7/1999 | Carr ..................... A61M 1/369 219/679 |
| 5,961,871 | A | | 10/1999 | Bible et al. |
| 7,442,271 | B2 | | 10/2008 | Asmussen et al. |
| 7,858,899 | B2 | | 12/2010 | Fujii et al. |
| 8,138,458 | B2 | * | 3/2012 | Okamoto ............... B01J 19/126 219/678 |
| 8,668,962 | B2 | | 3/2014 | Asmussen et al. |
| 2008/0053816 | A1 | * | 3/2008 | Suzuki .............. H01J 37/32192 204/164 |
| 2012/0097667 | A1 | * | 4/2012 | Niklasson .............. H05B 6/686 219/702 |
| 2013/0270261 | A1 | | 10/2013 | Hadidi et al. |

OTHER PUBLICATIONS

Whitehead, J. C. Plasma catalysis: A solution for environmental problems. Pure Appl. Chem. (2010), 82:1329-1336.

Szabo, D. V. et al. Microwave plasma synthesis of materials . . . a materials scientists viewpoint. (2014), Inorganics 2:468-507.

Hessel, V., et al. Energy, catalyst, and reactor considerations for (near)-industrial plasma processing and . . . nitrogen-fixation reactions. (2013) Catalysis Today 211:9-28.

* cited by examiner

BROADBAND MICROWAVE PROCESSING SYSTEM

CROSS REFERENCE TO RELATED APPLICATION

This application claims the benefit of Provisional Application Ser. No. 62/497,062 filed by the present inventors on Nov. 7, 2016, the entire disclosure of which is incorporated herein by reference.

BACKGROUND OF THE INVENTION

Field of the Invention

The invention pertains to systems and methods for using a broad band of microwave frequencies for various processes, including microwave plasma and microwave catalysis, and more particularly to performing such processes over a broad range of microwave frequencies in a waveguide applicator.

Description of Related Art

Microwave processing has been applied to a variety of processes in the past decades, including plasma processes and microwave catalysis. Microwave plasma processing is common and is used for various applications which include but are not limited to electron cyclotron resonance (ECR) heating, plasma etching, plasma cleaning and chemical vapor deposition of various coatings including diamond films. Many of these reactors are quartz bell jar enclosures within a metallic single mode cylindrical microwave cavity (e.g. U.S. Pat. No. 8,668,962). The size of the cavity is dictated by the frequency being used for any particular system (e.g. 915 MHz or 2.45 GHz). Other frequencies will generally not maintain a stable single mode in a cavity of a size intended for one particular frequency and hence will not be able to sustain the plasma.

Microwave plasma can also be ignited in a waveguide single mode applicator as described in U.S. Pat. No. 4,866,346. Microwave plasma can also be ignited by a slot antenna wave guide, or a tube passing through a waveguide or even in a conventional multimode microwave oven under appropriate conditions.

Other literature discloses microwave plasma torches (U.S. Pat. Nos. 7,442,271 and 7,858,899) for various rapid heating methods while U.S. Pat. Appl. Pub. 2013/0270261 discloses a plasma torch for materials processing. While all these apparatus involve plasma processes, they all operate at only one microwave frequency.

Szebo et al., ["Microwave Plasma Synthesis of Materials—From Physics and Chemistry to Nanoparticles: A Materials Scientist's Viewpoint", *Inorganics* 2014, 2:468-507] report a relation between the collision frequency and transferred energy to plasma elementary species at common microwave frequencies 0.915 GHz and 2.45 GHz, and at the less common industrial frequency 5.85 GHz. With increasing frequency the transferred energy decreases. Consequently, for nanoparticle synthesis with microwave plasma, a lower microwave frequency leads to higher reaction temperatures, while lower synthesis temperatures can be realized with higher frequencies.

Microwave catalysis has been explored extensively and the details are provided in a recently published book "Microwave in Catalysis" Methodology and Applications, Edited by Satoshi Horikoshi and Nick Serpone, 2016 Wiley-VCH Verlag GmbH & Co. KGaA.

Almost all the work reported has been done using fixed frequency microwave sources, primarily 2.45 GHz. Microwaves have been applied to various kinds of catalytic reactions and in most case the catalytic reactions are enhanced. However, there is one major problem, especially when the catalyst is either metallic or has metallic particles. Just as one sees arcing in the kitchen microwave oven when a fork or knife is (intentionally or unintentionally) left in the oven, the fixed frequency microwave causes arcing or localized hot spots at the metal particles within the catalyst.

In variable-frequency microwave (VFM) heating systems, frequency sweeping is used to maintain a constantly-shifting pattern of standing waves in a multimode cavity, whereby an extremely uniform time-averaged power density is established throughout the working volume of the cavity. The rapid sweeping through a bandwidth of frequencies eliminates arcing and also provides uniformity within the processing cavity. The basic VFM approach is well-known and taught in several U.S. patents [see, e.g., U.S. Pat. No. 5,321,222 for a basic description of the technique]. In conventional VFM systems, the multimode cavity is significantly larger than one wavelength in all three dimensions to allow for the establishment of many superimposed modes, as explained in detail in U.S. Pat. No. 5,961,871 to Bible et al.

It is well documented that rotational spectroscopy may be used to measure energies of transitions between quantized rotational states of molecules in the gas phase. The spectra of polar molecules can be measured in absorption or emission by microwave spectroscopy or by far infrared spectroscopy. The rotational spectra of non-polar molecules cannot be observed by those methods, but can be observed and measured by Raman spectroscopy. Rotational spectroscopy is sometimes referred to as pure rotational spectroscopy to distinguish it from rotational-vibrational spectroscopy where changes in rotational energy occur together with changes in vibrational energy.

For microwave processing of solids or viscous liquids, the free rotation of molecules is not possible and one may not be able to differentiate the influence of frequency. However, for microwave processing of gases one may be able to observe reaction enhancement at a particular frequency or small bandwidth around that particular frequency. It is desirable, therefore, to have a broadband microwave processing system that allows the user to explore a bandwidth of frequencies (for numerous processes), identify the best center frequency, and then sweep around that center frequency for a robust and sustainable process for small scale reactions.

Objects and Advantages

Objects of the present invention include the following: providing a microwave processing system having a broadband power source with a coaxial output; providing coaxial to waveguide transitions that connect to plurality of waveguides each supporting a subset of frequencies from the broadband power source; providing a switching mechanism that allows choosing a single subset of frequencies supported by a selected waveguide; providing a plurality of robust applicators each fitted with sliding and/or tuning stub mechanism and sliding short and/or dummy load, so that the applicators are capable of supporting both traveling and standing wave features; providing a microwave-compatible process tube that carries reactant fluids through an applicator to the plasma zone or to the catalyst housed in the tube; and, providing a control mechanism to deliver microwave power at frequencies supported by a selected applicator to investigate the influence of frequency on intended reactions in the process tube. The reactions could be investigated at discrete microwave frequencies or under the swept variable frequency mode. Numerous processes which include, but are not limited to, plasma processing of nanoparticles, microwave catalysis, or microwave plasma catalysis, may be studied and developed using the inventive system. The invention may be applied to microwave catalysis for clean energy technologies, organic synthesis, pharmaceutical chemistry, and many other uses. These and other objects and design advantages of the invention will become apparent from consideration of the following specification, read in conjunction with the drawings.

SUMMARY OF THE INVENTION

According to one aspect of the invention, a microwave processing system comprises:
 a broadband variable-frequency microwave source;
 a microwave switching means allowing microwave power to be delivered to a selected waveguide transition;
 a plurality of waveguide transitions, each of which respectively connects to the corresponding one of a plurality of waveguide applicators each capable of supporting a selected subset of frequencies from the broadband power source; wherein,
  the input side of each applicator has an impedance matching device connected to the microwave source;
  the output side of each applicator is connected to and terminates with a selected termination structure; and,
  each applicator includes at least one channel to allow a microwave-transparent tube to pass either through the broad wall or along the wave propagation direction so that the contents of the tube may be exposed to applied microwave power;
 a microwave compatible process tube that carries reactant fluids through the applicators, optionally connected to a vacuum pump on one end and gas supply on the other;
 a control mechanism to deliver microwave power at discrete frequencies supported by the selected applicator to investigate the influence of frequency on intended reactions in the process tube; and/or,
 a control mechanism to deliver microwave power at continually swept preferred frequency range supported by the selected applicator to optimize the influence of frequencies on intended reactions in the process tube.

According to another aspect of the invention, a method of performing microwave catalysis includes the steps of:
 generating microwave power over a selected frequency range;
 introducing the microwave power into a waveguide applicator capable of maintaining the microwave power in a selected propagation mode by the use of a selected termination structure;
 placing a microwave-transparent tube within the applicator; and,
 placing a selected catalytic material in the tube while passing a selected fluid species through the tube to produce a desired chemical reaction in the gaseous species According to another aspect of the invention, a method of performing microwave catalysis includes the steps of:
 generating microwave power over a selected frequency range;
 introducing the microwave power into a waveguide applicator capable of maintaining the microwave power in a selected propagation mode by the use of a selected termination structure;
 placing a microwave-transparent tube within the applicator; and,
 placing a selected catalytic material in the tube and passing a selected fluid species through the tube in the presence of a plasma to produce a desired chemical reaction in the gaseous species.

According to another aspect of the invention, a method of performing microwave catalysis includes the steps of:
 generating microwave power over a first selected frequency range and introducing it into a first waveguide applicator capable of maintaining the microwave power in a selected propagation mode by the use of a selected termination structure;
 placing a microwave-transparent tube within the first applicator and passing a selected gaseous composition therethrough;
 establishing a plasma in the first applicator sufficient to produce a desired gaseous intermediate composition;
 generating microwave power over a second selected frequency range and introducing it into a second applicator capable of maintaining the microwave power in a selected propagation mode by the use of a selected termination structure;
 placing a second microwave-transparent tube within the second applicator and placing a selected catalytic material in the second tube;
 passing the gaseous intermediate composition therethrough; and,
 heating the catalytic material to produce a desired chemical reaction and convert the gaseous intermediate composition to a final gaseous product composition.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting embodiments illustrated in the drawing figures, wherein like numerals (if they occur in more than one view) designate the same elements. The features in the drawings are not necessarily drawn to scale.

FIG. 2A is an isometric view of one half of the applicator including some optional features; FIG. 2B shows an isometric view of the two mating halves and a quartz tube that will be enclosed when they are brought together.

DETAILED DESCRIPTION OF THE INVENTION

The invention provides a system and method for using a broad band of microwave frequencies to investigate the influence of frequency on the energy transfer to a fluid for optimizing a plasma process, a catalysis process, and other purposes. It uses a microwave system that can operate over a broad bandwidth of frequencies to investigate the influence of frequencies for plasma processes as well for microwave heating or catalysis. If there are no metal particles in the catalyst fixed frequency microwaves can be used and one can vary the discrete frequencies to observe the influence of frequency on the reaction. However, if the catalyst has metal particles the frequency sweep will eliminate arcing while the exposure to varying microwave frequencies will heat the catalyst and contribute to enhancing the catalytic reaction.

Example

Figure 1A:
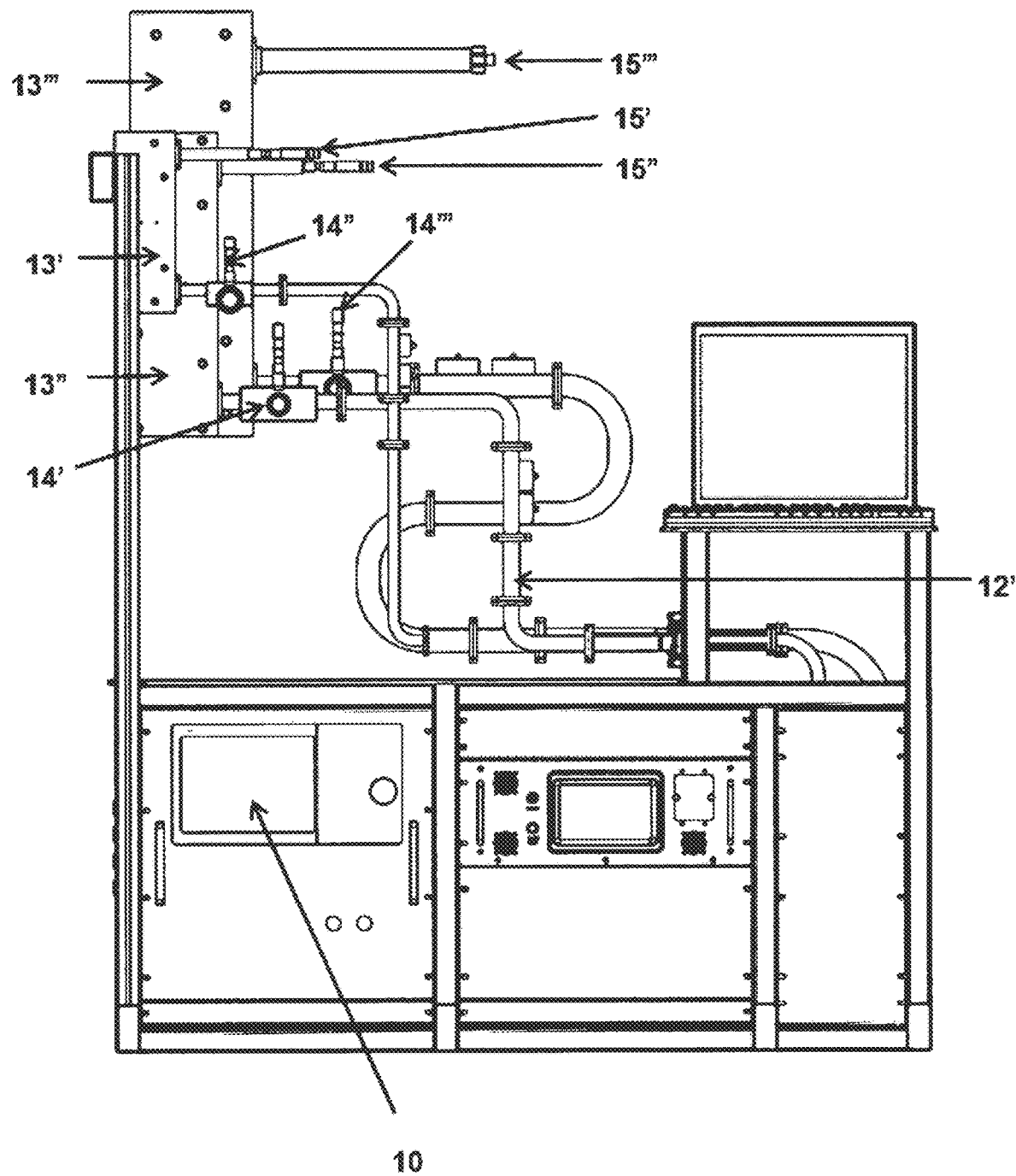
FIGS. 1A-C schematically illustrate an example of a system comprising three applicators powered with a single broadband rack-mount TWTA, with FIG. 1A presenting a front view, 1B presenting a back view, and FIG. 1C presenting a top view. The power delivered can be switched to the appropriate applicator and frequency range. Each applicator could be used for microwave plasma processes, microwave catalysis or microwave plasma catalysis.
Figure 1B:
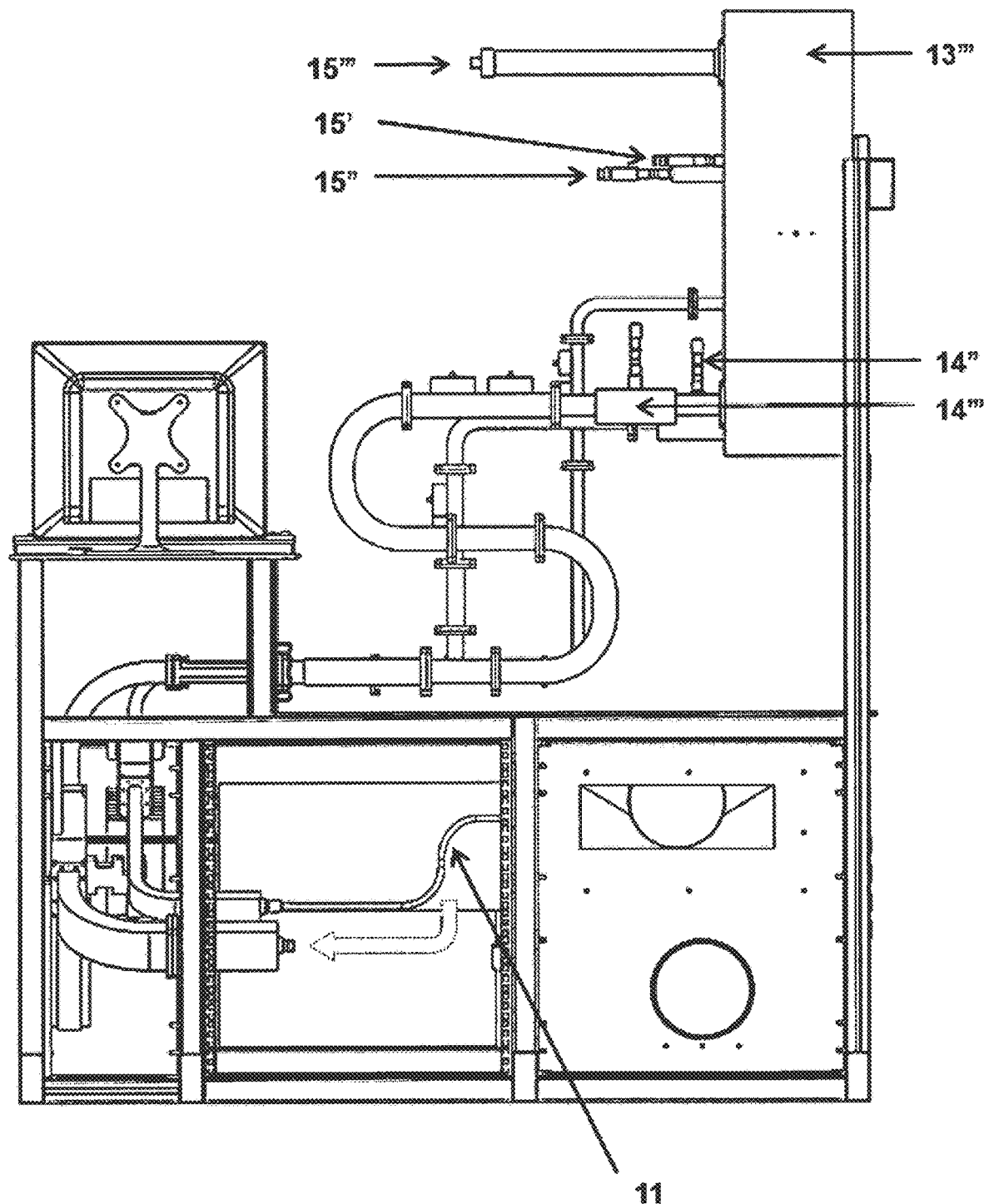
Figure 1C:
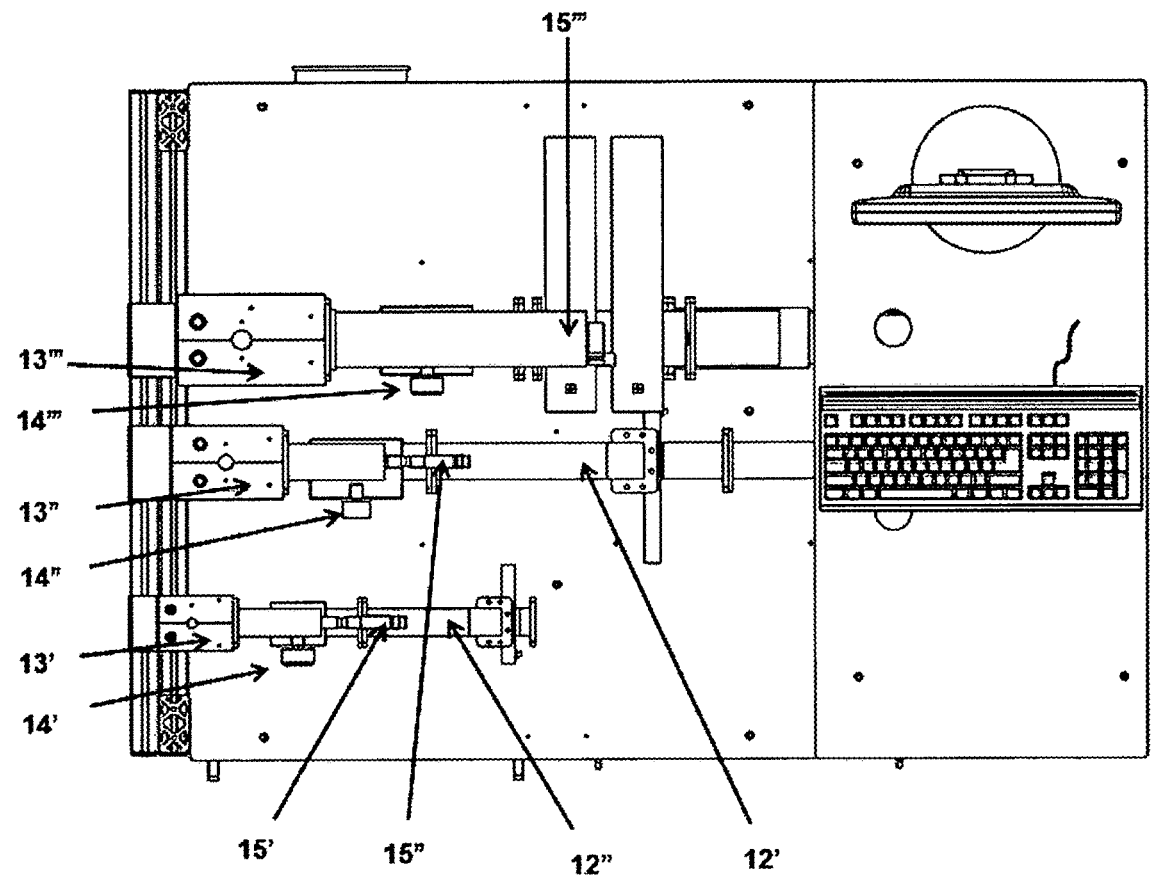

As shown generally in FIG. 1A, the invention includes a microwave heating system using a power source 10 (e.g., a 2.0-8.0 GHz, 500 W S/C band rack-mount TWTA) delivering a broad band of microwave frequencies. The output of the power source is a coax cable that can be connected either to the (combined) WR137 and WR187 waveguide or WR284 through one of the two coax-to-waveguide transitions. FIG. 1B shows the coax cable 11 connected to WR137 and WR187 transition while nothing is attached to WR284 transition. A dotted arrow shows how the coax cable 11 may alternatively be connected to use the WR284 transmission line and applicator. A manual waveguide attachment 12 allows connecting, through waveguide transitions, to selected applicators 13 (e.g., compatible with WR137, WR187 and WR284 waveguide dimensions, respectively). FIG. 1A shows 12' attached to the WR187 wave guide applicator whereas FIG. 1C shows 12" attached to the WR137 waveguide applicator. On the input side of each applicator 13 is a tuner 14, while the output side is connected to a termination structure 15, which may, for example, comprise a tuning short or dummy load. The tuning short may not be necessary for some larger loads but is available to make the operation robust for lighter loads. It will also be appreciated that the choice of termination structure allows one to select between different modes of microwave propagation within the applicator: Material to be treated is placed within the applicator. When using the dummy load, microwaves interact with the material in a traveling-wave mode, passing through the material and into the dummy load. Conversely, using a tuning short, a standing wave may be established within the applicator and the material to be processed may be placed at a location of maximum power density.

Example

Figure 2A:
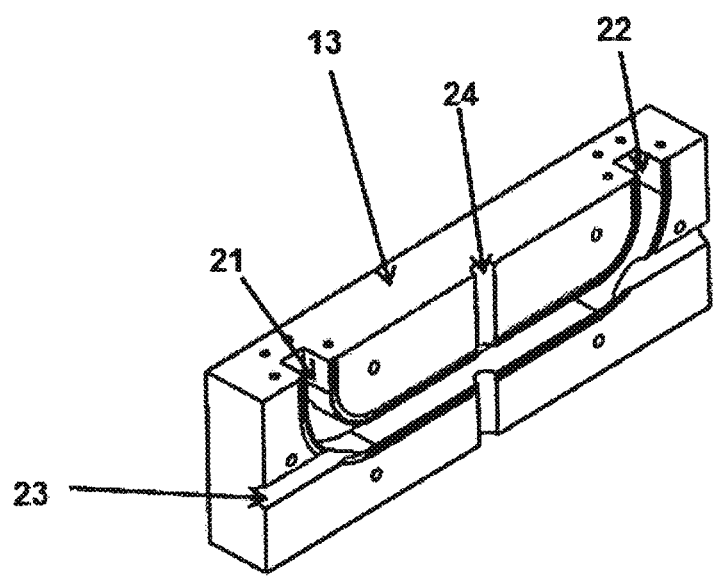
FIGS. 2A-B present a schematic diagram of a waveguide applicator in accordance with one aspect of the invention, which can be fabricated from a selected metal or alloy, and configured to allow a tube to pass through either perpendicular to the broad wall of the waveguide or along the propagation direction.
Figure 2B:
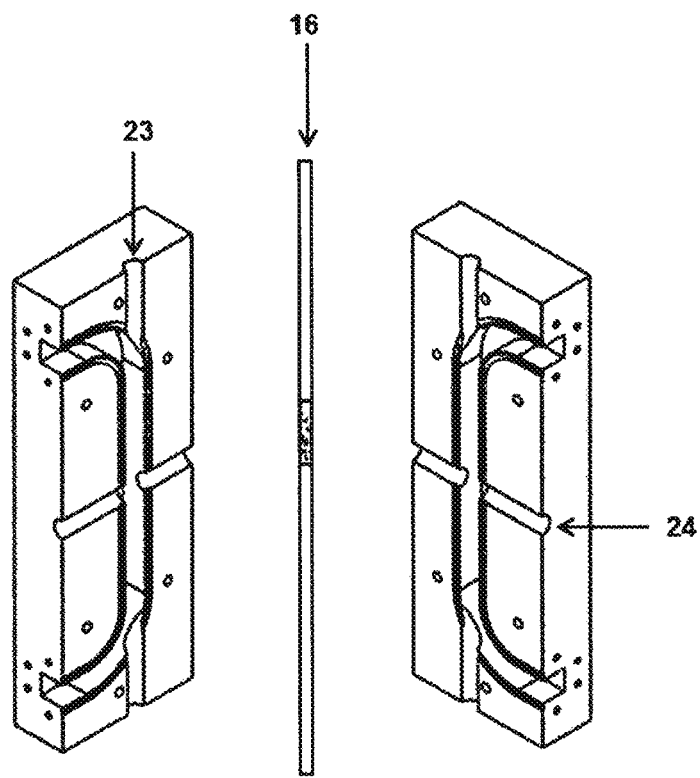

As shown generally in FIG. 2A, each individual applicator 13 is preferably fabricated in two opposing halves with flat mating surfaces. Each half is generally a mirror image of the other, as shown in FIG. 2B. Besides simplifying machining and finishing, this has the further advantage that the applicator may be clamped around the process tube 16 in clamshell fashion as shown schematically in FIG. 3, without the need to break any existing gas or vacuum connections to the process tube.

Although the system could be used for numerous reactions briefly described above, the system was initially tested for microwave plasma generation and microwave heating of a catalyst. A microwave-transparent process tube 16, situated within the applicator and passing therethrough, provides appropriate vacuum capability and gas feed, and may be used for microwave catalysis when the tube houses a catalyst with one or more gases coming in from one end, interacting with the microwave heated catalyst and exiting through the other end for collection and gas analysis. The same applicator could be used for microwave plasma catalysis, a situation in which the plasma and catalyst are in the same quartz tube.

Figure 4:
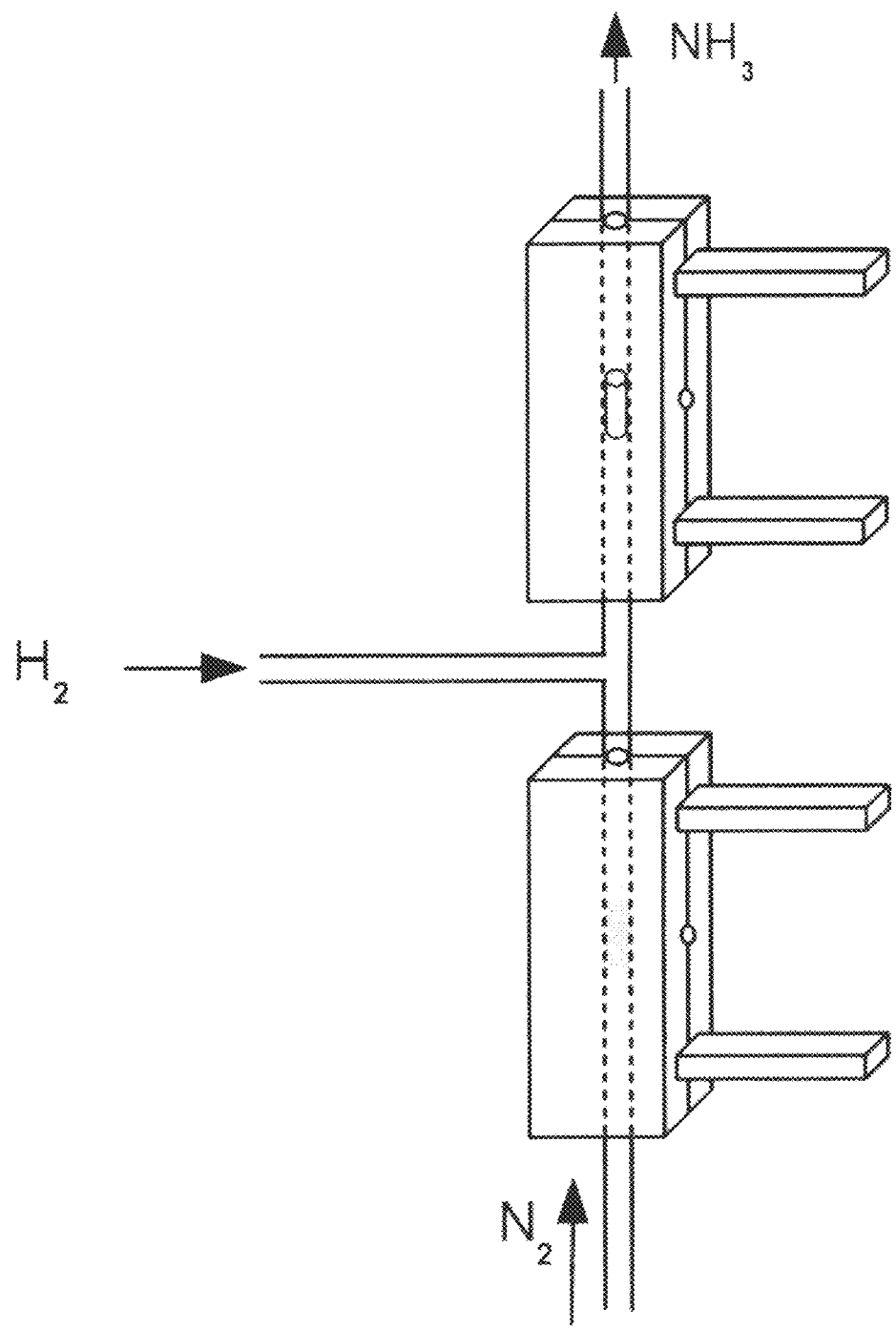
FIG. 4 schematically illustrates one setup for microwave plasma catalysis using two identical applicators, one for microwave plasma generation and the second one for microwave catalysis. The applicators are configured such that the quartz tube runs along the wave propagation direction.
Figure 5:
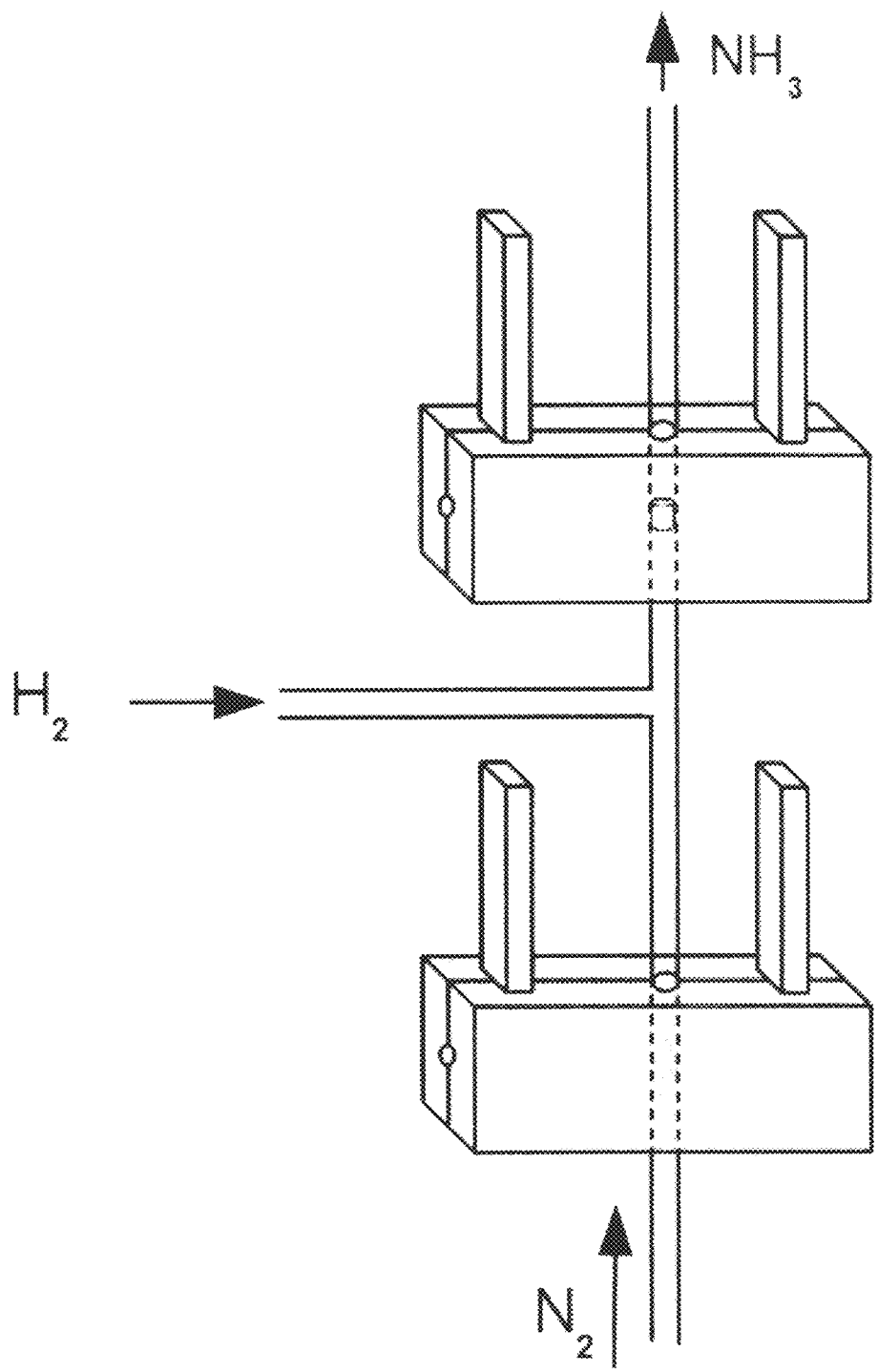
FIG. 5 schematically illustrates the setup for microwave plasma catalysis using two identical applicators, one for microwave plasma generation and the second one for microwave catalysis. The applicators are configured such that the quartz tube passes through the broad wall of the waveguide (i.e., perpendicular to the wave propagation direction).

Furthermore, two of these identical applicators could be close-coupled together for microwave plasma catalysis to provide, e.g., a reaction where the plasma activates nitrogen in one system, which later mixes with hydrogen and in the next system (as illustrated in FIG. 5) undergoes microwave catalysis to form ammonia. Each system would preferably have independent parameter controls to allow for optimization of individual processes. It will therefore be appreciated that each of the two applicators shown in FIGS. 4-5 may have its own independent power supply.

Another feature of this invention is the use of broad band microwave frequencies for appropriate applicators, all in the same system. Fixed frequency microwaves have been used for plasma processes as well as microwave catalysis. However, the use of variable frequency microwave plasma processes has been little-studied to date.

For microwave plasmas, the energy E, transferred to a charged species of mass m in an oscillating electrical field with frequency f is proportional to its charge Q, and inversely proportional to its mass m and the squared frequency f and is a measure of the temperature. In addition to ions and free electrons, microwave plasma consists of neutral gas species, as well as dissociated gas and finally also precursor molecules for the desired chemical reaction. Therefore, collisions between charged (electrons, ions) and uncharged species (molecules, atoms, or particles) influence the energy transfer to the particles. In this case, the collision frequency z, which is proportional to the gas pressure p, has to be also considered.

$$E \propto \frac{Q}{m} \frac{z}{f^2 + z^2} \quad (1)$$

As the collision frequency z increases with increasing gas pressure, the transferred energy is also a function of the gas pressure. Because of the significant temperature differences of the electrons and the ions, respectively neutral species, plasmas generated with microwaves are considered as non-equilibrium plasmas, or as non-thermal plasmas. These low overall temperatures in microwave plasmas can, e.g., reduce the tendency of particle agglomeration during particles synthesis.

With increasing frequency the transferred energy E decreases (note $f^2$ in denominator), hence lower synthesis temperatures can be realized with higher frequencies [see, e.g., D. V. Szabó and S. Schlabach, Microwave Plasma Synthesis of Materials—From Physics and Chemistry to Nanoparticles: A Materials Scientist's Viewpoint, *Inorganics* 2:468-507 (2014)].

Thus there is a desire to explore various (higher) frequencies for microwave plasma processes. Microwave plasmas have been generated by passing a quartz tube through the broad wall of a waveguide, i.e., normal to the direction of microwave propagation. Conventionally, this has typically been done at fixed frequencies, commonly 2.45 GHz and 915 MHz. The less common higher frequency 5.8 GHz can also be used for these experiments. Each frequency or frequency range will require particular waveguide dimensions. However, in conventional systems there is no means to change the frequency to study its influence on plasma processing.

Example

To explore variable frequency microwave plasma processing, Applicants first selected the commonly used C-band with frequency range 5.85-6.65 GHz, for which the WR137 waveguide is standard. The applicator designed and shown in FIGS. 2-3 was therefore fabricated for WR137 dimensions. It will be appreciated that the vacuum or pressure level, microwave power and tuning positions, all play a role in sustaining the plasma, but Applicants found that in this setup it was possible to do so at all frequencies 5.85, 6.05, 6.25, 6.45 and 6.65 GHz. Under appropriate vacuum and power conditions the plasma can be ignited or under non-optimal conditions a Tesla coil easily initiates the plasma, which is then stably maintained. If the microwave frequency is swept slowly one can observe the plasma move back and forth in the tube without any need for mechanical tuning. With this mode of operation the effective size of the plasma is essentially larger, while other parameters such as the power and pressure are held constant.

Similar applicators for other waveguide dimensions (WR430, WR340, WR284, WR187, etc.) can be fabricated that will allow the user to evaluate the influence of frequencies from the power source in the range of 2-8 GHz (or any suitable range). Those skilled in the art will appreciate that a rectangular waveguide might operate stably over a useful bandwidth of as much as one octave.

Example

For the specific case of a VFM source whose available bandwidth is 2-8 GHz, suitable waveguides that cover subsets of this band include: WR112, WR137, WR159, WR187, WR229, WR284, WR340, and WR430. The skilled artisan can therefore select particular frequency ranges for particular applications.

Example

Figure 3:
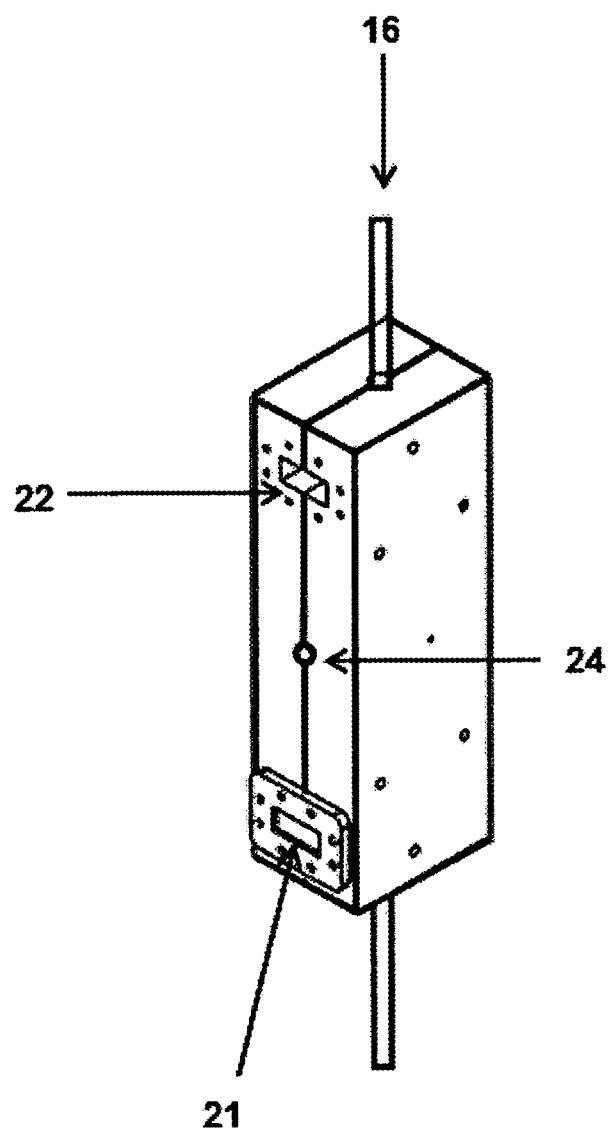
FIG. 3 shows an isometric view of two identical halves fastened together to form a waveguide applicator. The waveguide flange (input port) is shown attached at the bottom. One aspect of this design is that microwave leakage is minimized at the center of the broad wall seam. This requires minimal to no additional shielding at this interface. The two-piece construction allows the applicator to be clamped around the process tube (in clamshell style), which is useful where the process tube cannot be safely disconnected from upstream or downstream apparatus.

As shown schematically in FIG. 3, a microwave-transparent tube 16 (typically fused quartz) is disposed in applicator 13 so that it lies along the direction of microwave propagation. Since the energy from the entire wave is deposited within an extended portion of the tube, the plasma is easy to sustain. So much so, that with swept frequencies under various power and pressure conditions, the tuning plunger has little or no influence on the plasma position. With any fixed frequency the position of the plasma can be influenced with the tuning short. The inventive applicator thus provides a combination of standing and traveling wave features.

Example

Alternatively, the inventive applicator can be used in a different configuration as illustrated in FIG. 5, with the quartz tube 16 passing through the broad wall of the waveguide, i.e., in channel 24 instead of channel 23, so that it lies perpendicular to the path of the microwaves in the applicator. In this configuration, sustained tuning has historically been troublesome even in the case of microwave heating of any sample (or catalyst in this case). The heating rates are generally lower, because only a smaller portion of the sample (limited to the smaller dimension of the waveguide) couples to a portion of the standing wave. As the load heats, the dielectric properties of the sample change and the tuning stub and/or plunger must be constantly adjusted. When desired, the inventive applicator can nevertheless be used in the perpendicular configuration (FIG. 5), although the parallel configuration (FIG. 4) is preferred in many cases. Furthermore, the perpendicular configuration is more convenient for tests conducted at a fixed frequency, because as the frequency is varied substantial tuning is required. In contrast, the parallel configuration works well for both fixed frequency and variable frequency mode with minimal tuning requirements and with higher heating efficiencies.

Thermal plasma can be characterized by a thermodynamic equilibrium, with all species (electrons, ions, and neutral species) having the same temperature (energy). An example for thermal plasma is arc plasma and its temperature may be around 10,000 K. Non-thermal plasmas are characterized by a non-equilibrium between the temperature of the electrons and the ions. The temperature of the electrons ranges between several electron volt (eV), whereas the temperature of the positively charged ions and neutral species is significantly colder (about room temperature) leading to a very low overall temperature. Therefore, non-thermal plasmas, also called non-equilibrium plasmas, are favorable for the synthesis of materials (e.g., nanoparticles) at low temperatures.

Combining the two processes leads to plasma catalysis, which is an emerging technology that holds promise for improving existing technologies for numerous applications which include but are not limited to: air purification, hydrocarbon reforming, synthesis of nanomaterials, hydrogen production and ammonia production. The advantages of plasma catalysis over traditional catalysis are enabled by combining the high reactivity of the plasma with the high selectivity of the catalyst. The aim of plasma catalysis can be described as generating reactive species in the plasma and allowing them to react at the catalyst surface, forming the desired products with high conversion efficiencies and very high selectivity and at a low energy cost.

When catalysts are combined with plasmas, they are usually incorporated into non-thermal plasma. The catalyst is placed either inside the plasma (in-plasma catalysis) or after the discharge zone (post-plasma catalysis). Some studies show that the catalyst can be more effective at increasing gas conversion efficiencies when placed inside the plasma. In either case, the plasma can be used to supply energy for catalyst activation and it can also provide the reactive gas species needed for reactions on the catalyst surface.

For in-plasma catalysis, the catalyst is in contact with the plasma discharge and, therefore, is also in contact with the short-lived excited species, radicals, photons, and electrons. In the post plasma catalysis, the catalyst is only exposed to the long-lived species that exit the discharge. The catalyst material can be typically introduced in the form of pellets, honeycomb monoliths or foams.

Depending on the interest with short-lived or long-lived species, the inventive applicator can allow both in-plasma catalysis with a single system, and post-plasma catalysis with two identical systems having independent controls. Since, nothing changes in the system and applicator for in plasma catalysis, the following discussion will emphasize the post plasma catalysis arrangement.

Microwave catalysis is gaining momentum [see, e.g., Microwaves in Catalysis, by Horikoshi and Serpone, Wiley-VCH Verlag (2016)]. Although microwaves have shown promise, one issue is that many catalysts are, or can have, metal particles, which arc with exposure to a fixed frequency microwave field. The advantage with variable frequency microwave, where the frequencies are rapidly swept, is that there is no charge build up on metal components and hence no arcing. Applicants have described a novel near field applicator intended for use in heating a catalyst bed in U.S. patent application Ser. No. 15/731,881, filed on Aug. 18, 2017, the entire disclosure of which is incorporated herein by reference. The present invention however, relates more specifically to microwave plasma catalysis, where one set of applicator and microwave source may generate the plasma while another close-coupled system performs the catalysis.

Before going into the details of the method it is worthwhile to describe the Haber-Bosch (H-B) process which is traditionally used to synthesize ammonia from high pressure hydrogen and nitrogen gases at high temperatures with the help of catalysts. Ammonia has been one of the most valuable industrial chemicals and agricultural fertilizer. More recently for energy applications it is considered as a direct fuel or hydrogen carrier. The interest is to develop process intensified technologies for conversion of electrical or thermal energy from renewable sources into chemical form (ammonia) that can be stored, transported, and later converted into hydrogen or electricity.

Commercially, ammonia is produced at large-scale via H-B process. The synthesis reaction is carried out at temperatures ranging from 380 to 520° C. and pressures ranging from 150 to 250 atm. Optimization of process conditions as well as catalysts over the years have yielded 30% efficiency improvements. For further improvements new plasma processes are being explored, hence the interest in microwave plasma catalysis.

Example

Using the inventive applicator, under varying frequency microwave conditions the non-thermal plasma so generated can ionize and dissociate $N_2$ as shown in FIG. 4. Hydrogen fed into the tube right after the plasma process combines with the dissociated nitrogen and reacts on the catalyst to produce ammonia. Because each process has independent controls (frequency, power, and temperature) in principle each of the processes can be optimized for maximum reaction efficiency. The ease of tuning and sustaining the plasma at various discrete frequencies provides an excellent tool for exploring the influence of a particular frequency on the efficient dissociation of $N_2$ (or any other gas and process). Similarly the catalytic reaction in the second applicator can also be optimized for the most effective frequency that provides the most throughput of ammonia (in this example). It will be appreciated, however, that the inventive technique may be applied to any other microwave plasma catalysis reaction.

For academic investigation it will be advantageous to explore the best frequency for a particular reaction; however, for long production runs where there may be fluctuations in the pressure and gas flow, it would be safer to sweep in a narrow bandwidth around the best center frequency and not run the risk of losing tuning and coupling. Thus, even if an "optimal" frequency is known, some frequency sweeping may be advantageous.

Example

An applicator 13 was designed and fabricated for WR137 waveguide dimensions (C band), as shown schematically in FIGS. 2-3. Microwave power was supplied by a 2.0-8.0 GHz, 500 W S/C band rack-mount TWTA (10 in FIG. 1A) [Model VZS/C-2780C2; Communications and Power Industries Canada, Inc., Georgetown, Ontario]. The input 21 of applicator 13 was connected through a sliding tuning stub to this source, while the output 22 of the applicator was terminated with a tuning short. A quartz tube was passed through the applicator in channel 23, parallel to the waveguide as illustrated in FIG. 3, with one end connected to a vacuum pump and another to argon gas feed. Low microwave power (100-200 W) was delivered to the applicator while the argon was flowing at sub-atmospheric pressures. It was possible to tune, generate and sustain the plasma at all frequencies 5.85, 6.05, 6.25, 6.45 and 6.65 GHz supported by the WR137 waveguide. When the frequencies were swept between 5.85-6.65 GHz, with a slow sweep rate one could observe the plasma oscillate back and forth within the quartz tube.

Although the foregoing example was demonstrated at C band frequencies (5.85-6.65 GHz) and WR137 waveguide dimension, it may be easily adapted to all appropriate waveguide dimensions (WR340, WR284, WR187, etc.) compatible with the same 2.0-8.0 GHz, 500 W, TWTA power source. Alternatively, the applicator for C band frequencies could be powered with any other variable frequency microwave source providing swept frequencies supported by the applicator. This is particularly beneficial when two identical applicators and power sources are used, one for plasma and the other for catalysis as shown in FIGS. 4 and 5.

Example

Figure 6:
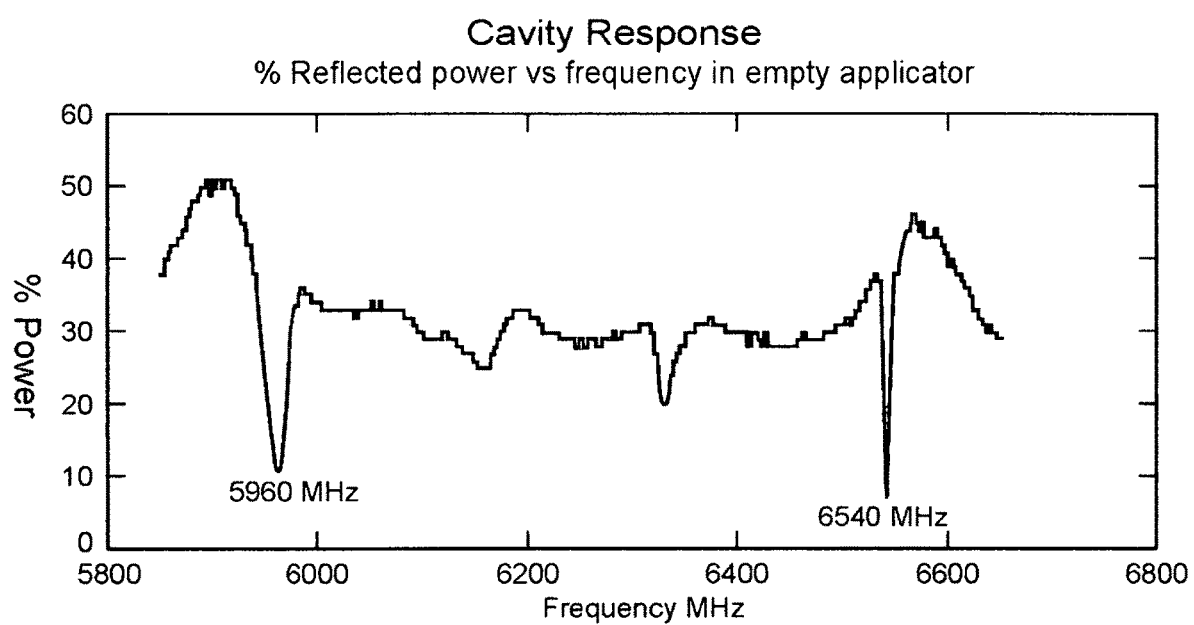
FIG. 6 illustrates the characterization of the empty WR137 applicator where the reverse power is observed for each frequency. At frequencies 5960 and 6540 MHz there are sharp decreases in reverse power, indicating very good match. Hence there is auto-ignition of the plasma even in the variable frequency sweep mode.

In the above example it was possible to tune, generate and sustain the plasma at all discrete frequencies 5.85, 6.05, 6.25, 6.45 and 6.65 GHz supported by the WR137 waveguide applicator. But if one starts with variable frequency it may not always be easy to ignite the plasma. Under these non-optimal conditions a Tesla coil easily initiates the plasma, which is then stably maintained. FIG. 6 shows the reflected power as a function of frequency in the WR137 applicator. At a given tuning condition the frequencies of 5960 MHz and 6540 MHz show a sharp reduction in reflected power. Under the same tuning condition if one starts with variable frequency sweep with a bandwidth that includes both 5960 and 6540 MHz frequencies, there was auto-ignition of the plasma and the sweep tends to sustain the plasma very well. Thus if one characterizes the applicator ahead of time and selects a bandwidth that catches multiple matched frequencies even with variable frequency one can have auto-ignition as well as stable plasma over the processing duration.

Example

In the same system the vacuum pump and argon supply were detached from the quartz tube. The tube was removed and another tube with a simulated catalyst held at the appropriate location in the tube was placed in channel 23 the applicator. A low level of power (100-200 W) was delivered to the applicator. It was easy to tune the sliding tuning stub and the terminating tuning short at all discrete frequencies 5.85, 6.05, 6.25, 6.45 and 6.65 GHz, all supported by the WR137 waveguide. The temperature of the simulated catalyst rapidly reached 900° C.-1000° C. for each frequency and the glow was visible through the view port formed by the open end of transverse channel 24. This view port may also be used for temperature monitoring and control, as well as for other observations and measurements, e.g., optical spectroscopy of plasma emissions. When the frequencies were swept between 5.85-6.65 GHz, the temperature dropped by only about 10° C. because the swept frequencies did not have the optimum tuning. But the robustness of the applicator and process is that it minimizes the risk of losing coupling at a fixed frequency, which would cause the temperature to drop significantly.

Example

As noted above, applicator 13 preferably has two channels 23, 24 so that the microwave-transparent tube may be placed parallel or normal to the microwave path. In either configuration, the unused channel may be used as an optical port. The channels were designed to be long enough (relative to their diameter) to act as microwave chokes. However, it is possible to have a larger diameter channel and then add external chokes extending from the block if needed.

For in-plasma catalysis, a catalyst can be placed within the quartz and the above steps performed to conduct the microwave plasma catalysis process. It would be a combination of the two examples provided above where the microwave energy would be delivered to the applicator to generate the plasma and heat the catalyst as well.

For post-plasma catalysis, the longer quartz tube within the applicator allows one to place the catalyst towards the end of the tube (still in applicator toward tuning short) while the plasma could be generated in the other portion of the tube within the applicator (towards the sliding tuning stub). Although this configuration is possible, the two loads—plasma and catalyst, will require additional effort to establish and maintain appropriate tuning of the system.

For post-plasma catalysis, it would be preferable in many cases to close-couple two identical systems shown in FIGS. 4 and 5. It will be appreciated that one could, in principle, combine the two applicators in FIG. 4 into one longer applicator and inject the second gas through channel 24. It will further be appreciated that in general, gas flow may be in the same direction as that of microwave propagation, or it may run counter to the flow of microwave energy. Applicants contemplate that single applicator may have more than one channel 24 disposed at selected locations along its length, so that gas may flow first through one such channel and then be directed, via external tubing, into the second channel for a second treatment. Such an arrangement may be particularly useful in the standing wave mode with an applicator that is several wavelengths long, so that channels 24 may each be positioned at a point of maximum power density.

Example

One applicator 13 fabricated for WR137 waveguide or C band was connected through a sliding tuning stub to a variable frequency power source, while the other side of the applicator was terminated with a tuning short. This system was powered and tuned to generate and sustain the plasma, where nitrogen can be activated as shown in FIG. 4.

Another identical system was set up for the catalytic reaction. Both systems have independent controls for tuning and power delivery so that both processes could be optimized. Power was delivered into the second applicator to heat the catalyst. The tube exiting the plasma applicator has hydrogen fed into it before going into the catalysis applicator. The activated nitrogen and hydrogen reach the hot catalyst where they react to form the desired ammonia, which is collected on the other end of the tube.

Example

Figure 7:
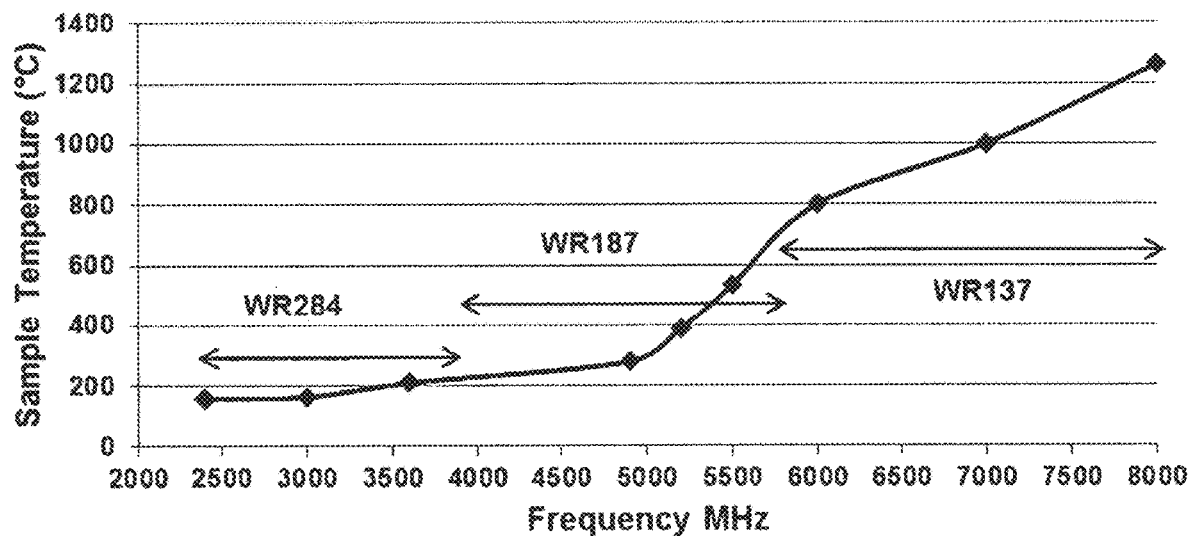
FIG. 7 shows the heating of a simulated sample (8 grams of silicon carbide and silica mixed in a 1:1 ratio by weight) in the three applicators at selected frequencies.

For comparison of the effectiveness of a process over a range of frequencies 2.0-8.0 GHz, a simple test was conducted that simulated the heating of a ceramic catalyst. Silicon carbide and silica powders were mixed in the ratio of 1:1 by weight and 8 grams of mixture was placed in a 12 mm diameter quartz tube. This tube (optimum for WR137) goes through the channel 23 for all WR137, WR187 and WR284 applicators. During the heating process the temperature was measured through port 24 on each applicator. The highest temperature achieved at each (selected) frequency was observed and is plotted in FIG. 7. As the frequency increases the highest temperature achieved also increases. However, even though the higher frequency is supposed to have higher heating efficiency, the overall increase in temperature is not entirely frequency dependent. It is well known that the loss tangent of ceramic materials generally increase as temperature rises. The higher frequency may push the temperature a little higher but as the loss tangent goes up, the increased heating efficiency causes a further rise in temperature. The overall temperature rise may not be purely frequency dependent, but nevertheless was triggered by higher frequency increasing the temperature and loss tangent and hence the final temperature achieved.

Although the example shows both applicators sized for C band (5.85-6.65 GHz) frequencies and WR137 waveguide dimensions, it is possible to change either of the applicator for other waveguide dimensions (WR340, WR284, WR187, etc. for an optimal process) while both being powered by two identical 2.0-8.0 GHz, 500 W, TWTA power sources.

The above examples pertain especially to ammonia synthesis with $Fe_2O_3/MgO$ (and to $Ru/Al_2O_3$ and $Ru/MgO$) catalyst, but there are other reactions which include, but are not limited to, plasma catalysis on hydrocarbon reforming for hydrogen production on $NiO/Al_2O_3$ catalyst, air purification and synthesis of nanomaterials, that may be performed by the inventive system described above. It will be appreciated that the inventive apparatus may equally well be used for various reactions that may occur in a liquid phase, e.g., in the production of specialty pharmaceuticals. So it will be understood that the fluid contained within the tube may be liquid, gas, or a combination of the two, and may further contain solid particulate phases, micelles, living cells, bacteria, viruses, etc. It will further be appreciated that the system may be used for both homogeneous and heterogeneous catalysis. Thus, the term "fluid" is intended broadly to encompass gases, plasmas, liquids, foams, emulsions, slurries, solid particulates entrained in a gas stream, and any other single- or multi-phase mixture that can be transported through a tube by pressure.

Additional aspects of the invention are summarized as follows:

In accordance with one aspect of the invention, a microwave applicator comprises:

a block comprising two opposing halves with flat mating surfaces and at least one channel to accommodate a microwave-compatible process tube lying parallel to the mating surfaces and held therebetween when the mating surfaces are drawn together;

a microwave passage in the block that provides for transmission from one end of the block to the other;

an input port on one surface of the block to connect said block to a waveguide and accept therefrom incoming microwave power over a selected frequency range; and, an internal bend to direct the incoming microwave power into a path parallel to the mating surfaces of the metal block so that material contained within the microwave process tube may be exposed to the directed microwave power.

Further features that may be incorporated (individually or together) into this aspect of the invention include:
a) the block may contain a second bend to direct unabsorbed microwave energy to an exit port and secondary tuning device or dummy load;
b) the block may contain a second channel, lying parallel to the mating surfaces and oriented perpendicular to the first channel;
c) the block mating surfaces may be designed to mate at an optimum location to minimize microwave leakage along the seam (center of broadwall preferable);
d) the channels in the block may be of such dimensions as to effectively serve as microwave chokes;
e) the material contained within the microwave process tube may comprise a catalyst;
f) the material contained within the microwave process tube may comprise a flowing gas;
g) the block may contain two intersecting channels, each of which can accommodate a microwave transparent tube, and each of which can serve as an instrument port when the microwave transparent tube is in the other channel;
h) the metal block may further comprise mounting points for attaching selected accessories;
i) the metal block may further contain channels through which fluid may be circulated for thermal management;
j) at least one channel may be oriented so that microwave power may be applied to the material in the tube in either a traveling-wave or a standing-wave mode.

In accordance with another aspect of the invention, a microwave heating device comprises:

a microwave power supply operative over a first selected frequency range;

a plurality of interchangeable microwave applicators, each operative over a particular frequency range representing a selected fraction of the first frequency range, and each applicator comprising:

a waveguide adaptor to connect a power supply output port to a waveguide whose dimensions are suitable for the particular frequency range; and, a waveguide applicator connected to the waveguide and having an internal channel to accommodate a microwave compatible process tube so that microwave power from the power supply may be applied to a selected material contained within the tube.

Further features that may be incorporated (individually or together) into this aspect of the invention include:
a) the waveguide applicator may include a termination structure selected from the group consisting of sliding shorts and dummy loads;
b) the material in the tube may comprise an ionizable gas;
c) the material in the tube may comprise a solid catalyst;
d) the waveguide applicator may include a first zone in which a selected gas is exposed to a plasma to convert the gas to a selected intermediate composition, and a second zone in which the intermediate composition is exposed to a catalyst to convert the intermediate composition to a product gas composition.

According to another aspect of the invention, a microwave processing system comprises:

a broadband variable-frequency microwave source;

a microwave switching means allowing microwave power to be delivered to a selected waveguide applicator;

a plurality of waveguide transitions which connect to a plurality of waveguide applicators each capable of supporting a selected subset of frequencies from the broadband power source;

an input side of each applicator having a sliding tuning stub or EH tuner installed connected to the source;

an output side of each applicator connected to and terminating with a tuning short or dummy load;

each applicator containing integral chokes to allow a microwave compatible tube to pass either through the broad wall or along the wave propagation direction while minimizing microwave leakage;

each applicator having a termination structure to enable the establishment of standing wave or traveling wave propagation modes within the applicator;

a microwave compatible process tube that carries reactant fluids through the applicators, connected to a vacuum pump on one end and gas supply on the other;

a control mechanism to deliver microwave power at discrete frequencies supported by the selected applicator to investigate the influence of frequency on intended reactions in the process tube; and, a control mechanism to deliver microwave power at continually swept preferred frequency range supported by the selected applicator to optimize the influence of frequencies on intended reactions in the process tube.

According to another aspect of the invention, a method of performing microwave catalysis includes the steps of:

generating microwave power over a selected frequency range;

introducing the microwave power into an applicator capable of maintaining the microwave power in a selected propagation mode by the use of a selected termination structure;

placing a microwave-compatible tube within the applicator; and, placing a selected catalytic material in the tube while passing a selected gaseous species through the tube to produce a desired chemical reaction in the gaseous species According to another aspect of the invention, a method of performing microwave catalysis includes the steps of:

generating microwave power over a selected frequency range;

introducing the microwave power into an applicator capable of maintaining the microwave power in a selected propagation mode by the use of a selected termination structure;

placing a microwave-compatible tube within the applicator; and, placing a selected catalytic material in the tube and passing a selected gaseous species through the tube in the presence of a plasma to produce a desired chemical reaction in the gaseous species.

According to another aspect of the invention, a method of performing microwave catalysis includes the steps of:

generating microwave power over a first selected frequency range;

introducing the microwave power into a first applicator capable of maintaining the microwave power in a selected propagation mode by the use of a selected termination structure;

placing a microwave-compatible tube within the first applicator and passing a selected gaseous composition therethrough;

establishing a plasma in the first reactor sufficient to produce a desired gaseous intermediate composition;

generating microwave power over a second selected frequency range;

introducing the microwave power into a second applicator capable of maintaining the microwave power in a selected propagation mode by the use of a selected termination structure;

placing a second microwave-compatible tube within the second applicator and placing a selected catalytic material in the second tube;

passing the gaseous intermediate composition therethrough; and, heating the catalytic material to produce a desired chemical reaction and convert the gaseous intermediate composition to a final gaseous product composition.

We claim:

1. A microwave processing system comprising:
   a broadband variable frequency microwave (VFM) source including a coaxial output cable;
   a plurality of waveguide applicators, each of which includes a waveguide transition and is capable of supporting a selected subset of frequencies within the operative bandwidth of said broadband VFM source; wherein:
   each of said waveguide transitions may be connected to said coaxial cable so that microwave power will be directed to a selected applicator; and wherein:
   each of said waveguide applicators includes at least one channel through which a microwave transparent tube may be run so that process fluid flowing through said tube may be exposed to microwave power in said applicator.

2. The system of claim 1 wherein said broadband VFM source has an operating bandwidth of at least one octave.

3. The system of claim 2 wherein said broadband VFM source has an operating bandwidth of two octaves and said plurality of waveguide transitions are characterized by waveguide dimensions selected from the group consisting of: WR112, WR137, WR159, WR187, WR229, WR284, WR340, and WR430.

4. The system of claim 3 wherein said broadband VFM source has an operating bandwidth of 2-8 GHz, and said system comprises three waveguide applicators compatible respectively with WR137, WR187, and WR284 waveguides and operable respectively over bandwidths of 5.85-8.20, 3.95-5.85, and 2.60-3.95 GHz.

5. The system of claim 1 wherein each of said waveguide applicators comprises an impedance matching device on the input side thereof.

6. The system of claim 1 wherein each of said waveguide applicators comprises a termination structure on the output side thereof.

7. The system of claim 6 wherein at least one of said waveguide applicators operates in traveling wave mode and said termination structure comprises a dummy load.

8. The system of claim 6 wherein at least one of said waveguide applicators operates in standing wave mode and said termination structure comprises a tuning short.

9. The system of claim 1 wherein said microwave power is delivered to one of said waveguide applicators at one or more discrete frequencies.

10. The system of claim 1 wherein said microwave power is delivered to one of said waveguide applicators by continuous sweeping over a selected bandwidth.

11. The system of claim 1 wherein each of said waveguide applicators comprises two channels, orthogonal to one another, so that said microwave transparent tube may be disposed either parallel or transverse to the direction of microwave propagation in said waveguide.

12. The system of claim 1 wherein said waveguide applicator further comprises microwave chokes proximate to the inlet and outlet ends of said microwave transparent tube to reduce microwave leakage from said applicator.

13. The system of claim 1 wherein said microwave transparent tube further contains a catalyst material to which said process fluid is exposed.

14. The system of claim 1 wherein said process fluid is a gas and the pressure of said gas is maintained at a level that will support a plasma at a selected microwave frequency and power.

* * * * *